US006917043B2

(12) United States Patent
Thomas et al.

(10) Patent No.: US 6,917,043 B2
(45) Date of Patent: Jul. 12, 2005

(54) INDIVIDUALLY ADDRESSABLE CATHODES WITH INTEGRATED FOCUSING STACK OR DETECTORS

(75) Inventors: Clarence E. Thomas, Knoxville, TN (US); Larry R. Baylor, Farragut, TN (US); Edgar Voelkl, Oak Ridge, TN (US); Michael L. Simpson, Knoxville, TN (US); Michael J. Paulus, Knoxville, TN (US); Douglas Lowndes, Knoxville, TN (US); John Whealton, Oak Ridge, TN (US); John C. Whitson, Clinton, TN (US); John B. Wilgen, Oak Ridge, TN (US)

(73) Assignee: UT-Battelle LLC, Oak Ridge, TN (US)

( * ) Notice: Subject to any disclaimer, the term of this patent is extended or adjusted under 35 U.S.C. 154(b) by 0 days.

(21) Appl. No.: 10/260,321

(22) Filed: Sep. 30, 2002

(65) Prior Publication Data

US 2003/0038244 A1 Feb. 27, 2003

Related U.S. Application Data

(63) Continuation of application No. 09/368,919, filed on Aug. 5, 1999, now Pat. No. 6,498,349, which is a continuation-in-part of application No. PCT/US98/01850, filed on Jan. 29, 1998, which is a continuation of application No. 08/795,003, filed on Feb. 5, 1997, now Pat. No. 5,892,231.
(60) Provisional application No. 60/128,196, filed on Apr. 7, 1999.

(51) Int. Cl.[7] .................. H01J 37/073; H01J 37/28; H01J 37/302

(52) U.S. Cl. .................. 250/398; 250/310; 250/492.2; 250/423 F

(58) Field of Search .................. 250/398, 492.2, 250/310, 423 F

(56) References Cited

U.S. PATENT DOCUMENTS

| 3,665,241 A | | 5/1972 | Spindt et al. ............... 313/351 |
| 4,090,106 A | * | 5/1978 | Okumura et al. ........... 250/311 |
| 4,130,761 A | | 12/1978 | Matsuda ..................... 250/398 |
| 4,409,487 A | | 10/1983 | Kuschel et al. ............. 250/398 |

(Continued)

FOREIGN PATENT DOCUMENTS

| DE | 196 38 109 A1 | 3/1997 | .......... H01J/37/317 |
| EP | 0 289 278 A2 | 2/1988 | .......... H01J/37/073 |
| EP | 0 520 780 A1 | 12/1992 | |
| EP | 0 780 879 A2 | 6/1997 | .......... H01J/37/317 |
| JP | 192682 | 7/1995 | |

OTHER PUBLICATIONS

Chang et al., "Electron beam technology SEM to microcolumn," *Microelec. Engin*, 32:113–130, 1996.

Chang et al., "Electron–beam microcolumns for lithography and related applications," *J. Vac. Sci. Technol.*, 14: 3774–3781.

Shimazu, N. et al., "Electron Beam System EB60 Permits Fast Direct Drawing on Wafers", JEE Journal of Electronic Engineering, vol. 23, No. 238, pp. 85–88, Oct. 1, 1986.

Chang, T. et al., "Arrayed miniature electron beam columns for high throughput sub–100nm lithography", J. Vac. Sci. Technol., Part B, vol. 10, No. 6, pp. 2743–2748, Nov. 1992.

(Continued)

Primary Examiner—Jack I. Berman
(74) Attorney, Agent, or Firm—John Bruckner PC

(57) ABSTRACT

Systems and method are described for addressable field emission array (AFEA) chips. A plurality of individually addressable cathodes are integrated with an electrostatic focusing stack and/or a plurality of detectors on the addressable field emission array. The systems and methods provide advantages including the avoidance of space-charge blow-up.

13 Claims, 6 Drawing Sheets

U.S. PATENT DOCUMENTS

| | | | | |
|---|---|---|---|---|
| 4,663,559 | A | | 5/1987 | Christensen ................. 313/336 |
| 4,724,328 | A | | 2/1988 | Lischke ....................... 250/398 |
| 4,731,537 | A | | 3/1988 | Williams et al. ............. 250/396 |
| 4,742,234 | A | | 5/1988 | Feldman et al. ............. 250/398 |
| 4,798,959 | A | | 1/1989 | Marks ....................... 250/492.2 |
| 4,902,898 | A | | 2/1990 | Jones et al. ............... 250/492.2 |
| 4,980,567 | A | | 12/1990 | Yasuda et al. ........... 250/396 R |
| 5,015,912 | A | * | 5/1991 | Spindt et al. ................ 313/495 |
| 5,126,574 | A | | 6/1992 | Gallagher ................. 250/492.2 |
| 5,138,237 | A | | 8/1992 | Kane et al. ................. 315/349 |
| 5,189,306 | A | | 2/1993 | Frei ......................... 250/492.2 |
| 5,363,021 | A | | 11/1994 | MacDonald ................. 315/366 |
| 5,384,463 | A | | 1/1995 | Honjo et al. ................ 250/398 |
| 5,514,847 | A | | 5/1996 | Makishima et al. ...... 250/423 F |
| 5,557,106 | A | | 9/1996 | Ioco ........................... 250/310 |
| 5,723,867 | A | | 3/1998 | Imura ...................... 250/423 F |
| 6,522,061 | B1 | * | 2/2003 | Lockwood .................. 313/495 |

OTHER PUBLICATIONS

Stebler, C. et al., "Miniaturized e–Beam Writer: Testing of Components", Microelectronic Engineering, vol. 27, No. 1/04, pp. 155–158, Feb. 1995.

T.H.P. Chang, et al, "Electron–beam Microcolumns for Lithography and Related Applications", J. Vac. Sci. Technol. B 14(6), Nov./Dec. 1996, p. 3774–3780.

Lloyd R. Harriott, "Scattering With Angular Limitation Projection Electron Beam Lithography for Suboptical Lithography", J. Vac. Sci. Technol. B 15(6), Nov./Dec. 1997, p. 2130–2135.

Scott Hector, et al., "X–ray Lithography for $\leq 100$ nm Ground Rules in Complex Patterns", J. Vac. Sci. Technol. B 15(6), Nov./Dec. 1997, p. 2517–2521.

J. Melngailis, "A Review of Ion Projection Lithography", J. Vac. Sci. Technol. B 16(3), May/Jun. 1998, p. 927–957.

C.W. Gwyn, et al., "Extreme Ultraviolet Lithography", J. Vac. Sci. Technol. B 16(6), Nov./Dec. 1998, p. 3142–3149.

M.A. Sturans, et al., "EL5: One Tool for Advanced X–ray and Chrome on Glass Mask Making", J. Vac. Sci. Technol. B 16(6), Nov./Dec. 1998, p. 3164–3167.

* cited by examiner

INDIVIDUALLY ADDRESSABLE CATHODES WITH INTEGRATED FOCUSING STACK OR DETECTORS

CROSS-REFERENCES TO RELATED APPLICATIONS

This application is a continuation of, and claims the benefit of 35 U.S.C. 120 of the filing date of, U.S. patent application Ser. No. 09/368,919 by inventors Clarence E. Thomas, et al. entitled "Electrostatically Focused Addressable Field Emission Array Chips (AFEA's) for High-Speed Massively Parallel Maskless Digital E-Beam Direct Write Lithography and Scanning Electron Microscopy" filed on Aug. 5, 1999, U.S. Pat. No. 6,498,349, which in-turn is both a continuation-in-part under 35 U.S.C. 120 and 37 CFR 1.371 of PCT/US98/01850, filed Jan. 29, 1998, which is a continuation of U.S. Ser. No. 08/795,003, filed Feb. 5, 1997, now U.S. Pat. No. 5,892,231, and a continuation-in-part under 35 U.S.C. 119(e) of U.S. Ser. No. 60/128,196, filed Apr. 7, 1999, the entire contents of the later three of which are hereby incorporated herein by reference as if fully set forth herein.

STATEMENT AS TO RIGHTS TO INVENTIONS MADE UNDER FEDERALLY-SPONSORED RESEARCH AND DEVELOPMENT

This invention was made with United States government support awarded by the United States Department of Energy under contract to Lockheed Martin Energy Research Corporation and/or Lockheed Martin Energy Systems Corporation. The United States has certain rights in this invention.

BACKGROUND OF THE INVENTION

1. Field of the Invention

The present invention relates generally to the field of electron (i.e., β radiation) beams. More particularly, the present invention relates to an addressable field emitter array that produces a spatially modulated electron beam matrix. Specifically, a preferred implementation of the present invention relates to a digitally addressable field emitter array in combination with an electrostatic acceleration grid and a magnetic lens assembly that includes a telecentric magnetic lens system and a correction lens system which together de-magnify the spatially modulated electron beam matrix onto a target wafer so as to directly write an electron resist with minimal distortion. The present invention thus relates to an addressable field emitter array of the type that can be termed lithographic.

2. Discussion of the Related Art

Within this application several publications are referenced by arabic numerals within parentheses. Full citations for these, and other, publications may be found at the end of the specification immediately preceding the claims. The disclosures of all these publications in their entireties are hereby expressly incorporated by reference into the present application for the purposes of indicating the background of the present invention and illustrating the state of the art.

Historically, optical lithography for semiconductor wafer production has been limited in resolution by the wavelength of the light source being used. At any particular wavelength of light, diffraction limits the focusability of an optical beam to a circle of a diameter approximately equal to the wavelength of the light source. Consequently, the fabrication industry has evolved several generations of lithographic light sources, each using a shorter wavelength than its predecessors. As microelectronic features have continued to shrink, the resolution of optical lithography is now a barrier to further increasing the density of chip features because suitable light sources of still shorter wavelength are no longer readily available. What is needed therefore is a way to increase the resolution of lithography.

A previously recognized solution has been to use an electron beam to expose an electron resist that has been coated on the surface of a semiconductor wafer, thereby enabling a pattern to be etched into the surface of the wafer through apertures formed in the subsequently developed resist. Electron beam technology is already a strong candidate for lithographically producing semiconductor devices with line widths on the order of approximately 0.1 micron. Electron beam imaging resolutions on the order of approximately 80 Å have been previously reported.[2]

Prior art electron beam devices of the type hereunder consideration, sometimes called electron guns, are well-known to those skilled in the art. A conventional electron beam is typically generated in a vacuum by electrical resistance heating of a suitable material to generate a stream of electrons. This stream of electrons is then electrostatically and/or magnetically focused. Two specific prior art electron beam devices are the cathode ray tube (CRT) and the scanning electron microscope (SEM), both of which generate and focus a beam of electrons in a vacuum.

For example, referring to FIG. 1, a conventional CRT electron gun with a bipotential lens structure is shown where an electron beam 110 is incident a screen 120 at a potential $V_s$.[1] This conventional electron gun includes a cathode 130 and a first apertured grid 140 which is maintained negative with respect to the cathode and controls the flow of electrons from the cathode. A second apertured grid 150 is located downstream of a cross over point and set at a positive voltage with respect to the cathode 130 so as to attract the electrons and shape the beam 110. A focus electrode 160 focuses the beam 110. The resolution can be improved by using an electromagnetic focus instead of the focus electrode 160.

Referring now to FIG. 2, the principle of electromagnetic deflection of an electron beam is illustrated where a flux of electrons 210 is incident a screen 220 at a deflection amplitude. An electromagnetic deflection coil 230 is composed of two perpendicular windings generating electromagnetic field perpendicular to the trajectory of the electron beam in the vertical and horizontal planes. A field of length l is applied perpendicularly to the flux of electrons 210 which have previously been accelerated to a velocity $V_B$. The flux of electrons 210, assuming the field intensity is uniform and of length l, is deflected onto a circular path of radius r. The corresponding angle of deflection is θ such that $$\sin\theta = Ni(l)/2.68D\sqrt{V_B}$$

where Ni is the number of ampere turns generating the magnetic field, D is the diameter of the cylindrical winding generating the field, l is the length of the field and $V_B$ is the accelerating voltage expressed in volts.

Although the electrons in the beams generated by the prior art electron beam devices have a wavelength, and a corresponding resolution limit that is imposed by diffraction, as a practical matter, the electron wavelength is so short that the diffraction of the electrons does not limit the resolution of the electron beam. This is because the prior art electron beam systems all include electrostatic lenses and/or magnetic lenses that generate stray fields. These stray fields are electromagnetic aberrations that result in distortions of the shape of the electron beam of a size that is at least on the order of nanometers. These distortions are larger than the wavelength of the electrons. Thus, the electromagnetic aberrations of the prior art devices limit the maximum resolution of the beam before the theoretical diffraction limit becomes an issue. Therefore, what is also needed is a way to reduce the effect of electromagnetic aberrations on the resolution of electron beam lithography.

Moreover, in the past, electron resist imaging has been relatively inefficient because the prior art electron beams have merely illuminated a single area and have had to be methodically scanned to write any sort of pattern. For example, referring to FIG. 3, a conventional fixed electron beam 310 is shown being truncated by a beam-shaping mask 320. Mask 320 includes a square shaped aperture. The mask 320 functions as a β radiation shield and gives the electron beam a square cross-section which is more useful for exposure of an electron resist. The square beam is then shaped by a lens 330 and subsequently deflected by a scanning deflector 340 before striking a target wafer 350 on which an electron resist is coated.

Still referring to FIG. 3, to scan the illustrated T-shaped pattern, either the electron beam must be scanned by the operation of the scanning deflector 340, or the target wafer 350 must be moved. In any event, this requires a large amount of time to image the design of even a simple integrated circuit (IC). As the complexity of integrated circuits (ICs) increases, more demanding semiconductor circuit design rules require correspondingly smaller electron beam spot sizes. And the smaller the spot size, the more time is required to complete the scanning of a given pattern. Thus, electron beam lithography has heretofore been slow, and therefore expensive. Therefore, what is also needed is an electron resist writing method having higher efficiency.

Still referring to FIG. 3, another problem with electron beam lithography has been that using a truncated electron beam involves the use of the mask 320 which absorbs significant energy from the screened electron flux. The thermal management of the mask 320 is problematic. This has prevented the use of any but the most simple shielding masks because masks with almost any degree of detail rapidly deform and melt due to their function as β radiation shields. This problem is exacerbated by the fact that as higher energy electrons having shorter wavelengths are used, the thermal energy that needs to be dissipated also increases. Therefore, what is also needed is a way to tailor the cross-section of an electron beam without using a mask.

The below-referenced U.S. patents disclose embodiments that were satisfactory for the purposes for which they were intended. The disclosures of both the below-referenced prior U.S. patents, in their entireties, are hereby expressly incorporated by reference into the present application for purposes including, but not limited to, indicating the background of the present invention and illustrating the state of the art.

U.S. Pat. No. 3,665,241 discloses a field ionizer and field emission cathode structures and methods of production. U.S. Pat. No. 5,363,021 discloses a massively parallel array cathode.

SUMMARY OF THE INVENTION

By way of summary, the present invention is directed to a digitally addressable field emitter array (e.g., a spatially modulated β radiation source). The array can be combined with a magnetic lens assembly including a telecentric magnetic lens system and a correction magnetic lens system which together de-magnify the field emitted beam array onto a target wafer for direct exposure of an electron resist. By additionally providing a relatively high electrostatic accelerating field prior to the lens assembly, the effect of aberrations caused by stray magnetic fields from the lens assembly can be minimized. An unexpected beneficial effect of the present invention, which is a substantial improvement, is to provide a low distortion flexible manufacturing tool that can function as a reprogramable virtual mask.

A primary object of the invention is to provide an apparatus that produces a digitally addressable array of electron beams (electron beam matrix). Another object of the invention is to provide an apparatus that can magnetically de-magnify the electron beam matrix with a magnetic lens assembly while minimizing in the effect of distortions in the matrix from aberrations due to the lens assembly. Another object of the invention is to provide an apparatus that can fill target wafer pixels by deflecting the matrix. Another object of the invention is to provide an apparatus that is cost effective. It is another object of the invention to provide an apparatus that is rugged and reliable, thereby decreasing down time and operating costs. It is yet another object of the invention to provide an apparatus that has one or more of the characteristics discussed above but which is relatively simple to manufacture and assemble using a minimum amount of equipment.

In accordance with a first aspect of the invention, these objects are achieved by providing a digital direct write electron beam lithography system, comprising: I) a digitally addressable field emission array including: A) a digital computer interface; B) a plurality of field emitters electrically connected to said digital computer interface; and C) an electrostatic bias grid operably connected to said plurality of field emitters; II) an electrostatic accelerator grid operably connected to said addressable field emission array; III) a magnetic lens assembly operably connected to said electrostatic accelerator grid, said magnetic lens assembly including: A) a telecentric magnetic lens system; and B) a correction magnetic lens system; and IV) a set of electrostatic deflection plates operably connected to said magnetic lens assembly. In one embodiment, the matrix system further comprises V) a target wafer electronically coupled to said plurality of field emitters through all of said electrostatic accelerator grid, said magnetic lens assembly and said set of electrostatic deflection plates.

Another object of the invention is to provide a method that can be used to directly write an electron resist with a pattern in a short period of time, without a mask. It is another object of the invention to provide a method that is predictable and reproducible, thereby decreasing variance and operating costs. It is yet another object of the invention to provide a method that has one or more of the characteristics discussed above but which is relatively simple to set up and operate.

In accordance with a second aspect of the invention, these objects are achieved by providing a method comprising programming an addressable field emitter array; and then producing a spatially modulated electron beam matrix with said addressable field emitter array; and focusing said spatially modulated electron beam matrix with a magnetic lens assembly. In one implementation, the method further comprises reprogramming said addressable field emitter array.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

A clear conception of the advantages and features constituting the present invention, and of the construction and operation of typical mechanisms provided with the present invention, will become more readily apparent by referring to the exemplary, and therefore nonlimiting, embodiments illustrated in the drawings accompanying and forming a part of this specification, wherein like reference numerals designate the same elements in the several views, and in which.

DESCRIPTION OF PREFERRED EMBODIMENTS

Figure 1:
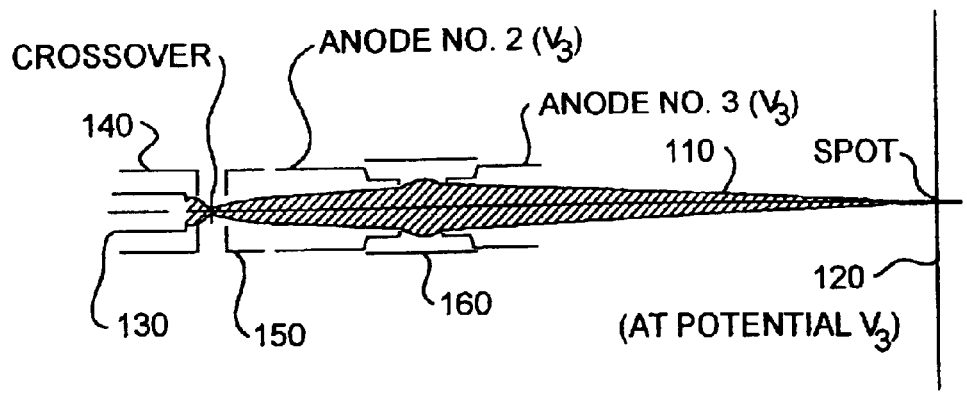
FIG. 1 illustrates a schematic view of a conventional electron gun, appropriately labeled "PRIOR ART."
Figure 2:
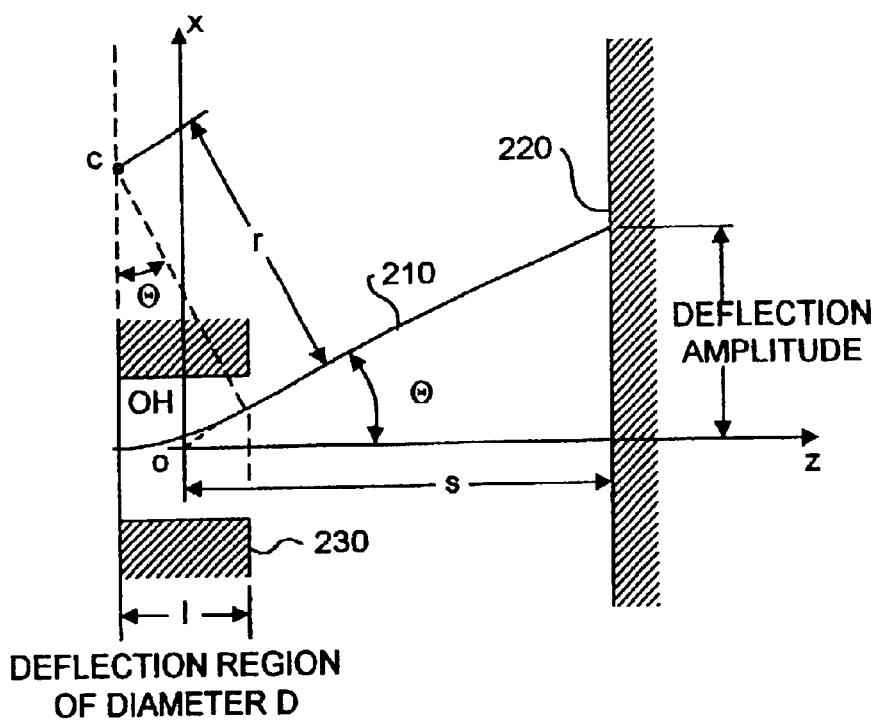
FIG. 2 illustrates a schematic view of a conventional electromagnetic electron beam deflection process, appropriately labeled "PRIOR ART."
Figure 3:
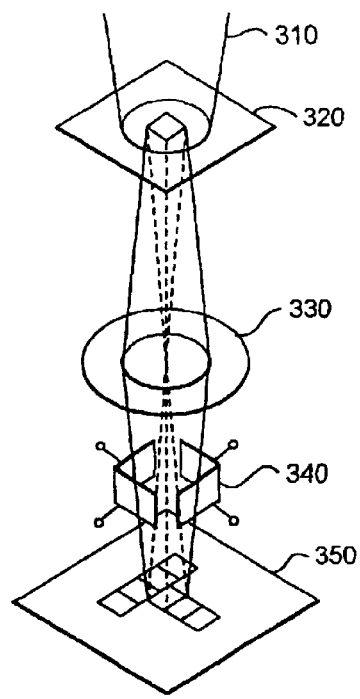
FIG. 3 illustrates a schematic view of a conventional electron resist writing configuration, appropriately labeled "PRIOR ART."

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention in detail.

1. System Overview

The above-mentioned requirements of high resolution and fast pattern writing are mutually contradicting and cannot be satisfied simultaneously in the case of a conventional electron beam gun. However, it is rendered possible to simultaneously satisfy these requirements to a certain extent by employing a digital direct write electron beam matrix system according to the present invention in consideration of the fact that the system can include a digitally addressable field emitter array that generates a spatially modulated $\beta$ radiation (i.e., electron) beam matrix that can be used for direct exposure of a circuit pattern in an electron resist in a short period of time, without a mask. Significantly, the array is reprogramable so as to permit the reconfiguration of the electron beam matrix in a fraction of a second, thereby making the invention an ideal flexible manufacturing tool.

The following definitions are used throughout the application. An emitter is defined as a potentially electron emitting material, such as diamond-like carbon (DLC). Alternative electron emitting materials can be based on carbon nanotubes (CNT), amorphous diamond on silicon and/or chemical vapor deposition (CVD) deposited amorphous carbon. An emitting surface is defined as that surface of an emitter from which electrons are emitted, if an electric field of sufficient strength is present. An emitting array (EA) is defined as an array of emitters. A field emitting array (FEA) is defined as an EA plus a corresponding bias grid. An addressable field emitting array (AFEA) is defined as an FEA plus the supporting integrated circuit (IC) which includes the logic and memory control (LMC). Turning to the electron beams themselves, an array of electron beams is defined as an electron beam matrix (EBM).

2. Detailed Description of Preferred Embodiments

Figure 4:
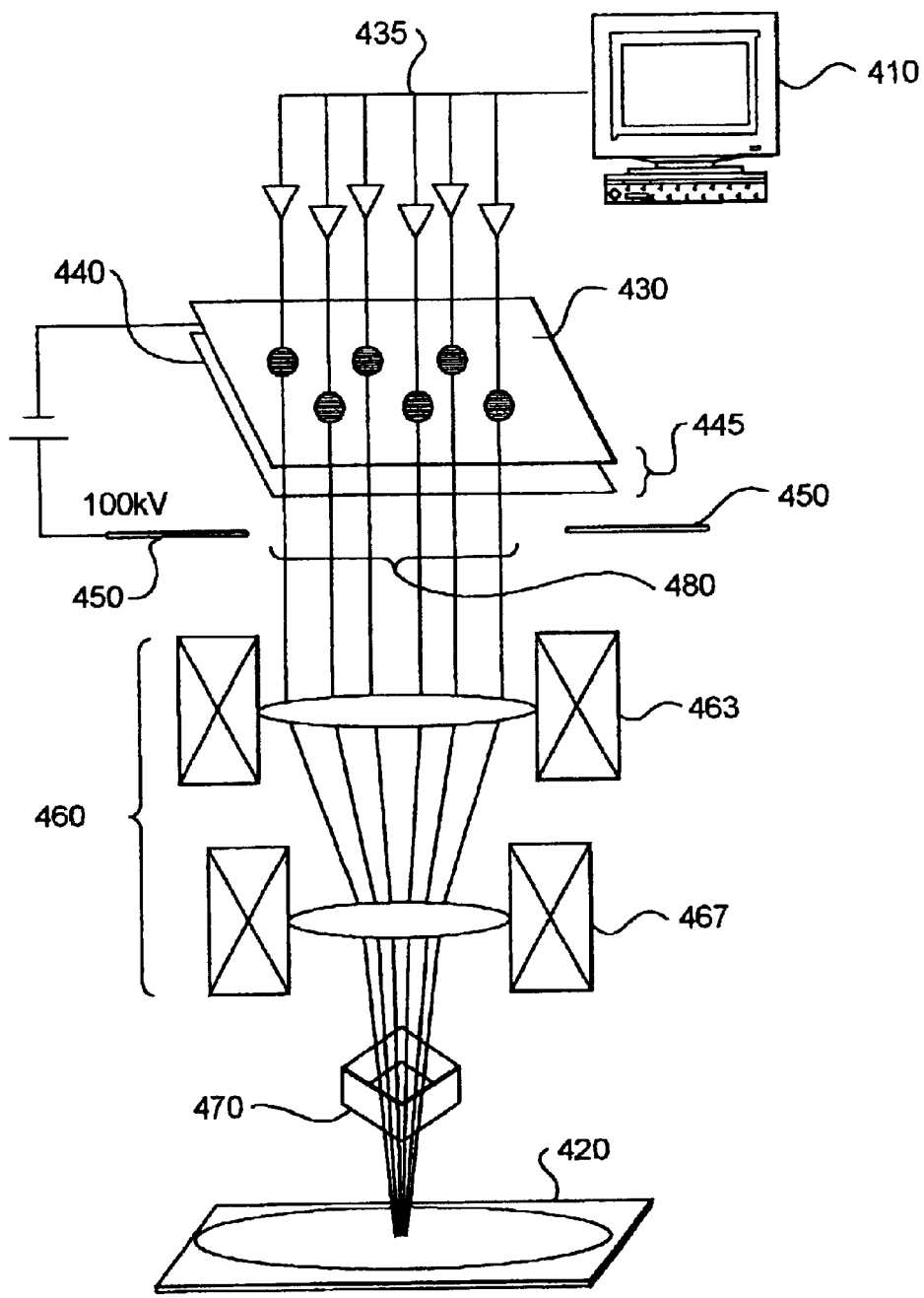
FIG. 4 illustrates a schematic view of a digital direct write electron beam matrix system apparatus, representing an embodiment of the present invention.

Referring now to FIG. 4, a digital direct write electron beam matrix lithography system according to the invention has several layers and a remote computer control 410. The system also includes a target wafer 420, which can be precoated with an electron resist.

A first layer of the system includes an emitter array 430 (EA). An emitter array (EA) is a two dimensional array of miniature cathodes used for electron beam sources. The EA 430 can be a close packed emitter array so as to achieve higher information density. The programming-reprogramming of the EA 430 can be achieved through a direct digital computer interface 435 that is connected to the remote computer control 410. A small EA might contain a 10×10 array of field emission devices, each with multiple computer control connections. Programming such a small EA would require less than approximately 10 milliseconds (ms), and a single central processing unit (CPU) can control a plurality of such AFEAs. The individual field emission devices can be made of a coating of diamond-like carbon, or diamond film.

A second layer of the system includes an electrostatic bias grid 440. The electrostatic bias grid 440 can be a metallic layer that is integrally joined with the EA 430. Alternatively, the grid 440 can be a structure that is separate from, but located proximal to, the EA 430. It should be noted that the required turn-on voltage for emission of electrons from diamond-like carbon (or diamond) is on the order of 3 volts per micron. Together, the EA 430 and the grid 440 compose a field emitting array 445 (FEA). The array of electron beams that emanate from FEA 445 can be termed an electron beam matrix 480 (EBM).

A third layer of the system includes an electrostatic accelerator grid 450 which brings the electrons in the EBM up from an energy of a few volts to an energy of from approximately 100 kV to approximately 200 kV. It should be noted that this high energy level advantageously makes the electrons relatively immune to any subsequently encountered focusing errors caused by small stray magnetic and/or electric fields. More specifically, at high energies the electron radius of curvature due to small stray magnetic fields becomes negligible. Further, it should be noted that these high energies also enable the electrons to adequately penetrate the lithographic resist material(s) that are coated on the target wafer 420.

A fourth layer of the system includes a magnetic lens assembly 460 which can image and/or de-magnify the EBM 480 that subsequently impacts onto the target wafer 420. The magnetic lens assembly 460 can include a telecentric magnetic lens system 463 and a correction magnetic lens system 467 which together de-magnify the EBM 480 onto the target wafer 420.

The magnetic lens assembly 460 can be based on a GATAN imaging filter which is a magnetic lens system that is readily commercially available from the GATAN Company of Pleasanton, Calif. This imaging filter uses cylindrical magnetic lenses instead of round lenses. Further, this filter causes the electrons to cross-over along a line rather that at a cross-over point. The use of this filter preferably includes the generation of sequential perpendicular line cross-overs. The correction tens system 467 can be based on a hexapole (hektupole) corrector lens. The hexapole corrector is to a quadrapole corrector as the quadrapole is to a dipole. The magnetic lens assembly 460 can include coils fabricated from superconducting materials so as to minimize stray fields. Further, the coils can be fabricated from superconducting oxides so that inexpensive liquid nitrogen will provide sufficient cooling for operation of the system.

A fifth layer of the system includes a set of electrostatic deflection plates 470 of nanometer scale deflection. This nanometer scale deflection can be for the purpose of filling-in of write pixels on the surface of the target wafer 420. Therefore, the size of the write pixels can be defined to be larger that the cross-section of each individual electron beam at the surface of the target wafer 420. This will allow complete writing of, for example, a 100 nm×100 nm pixel with a 30 nm×30 nm electron beam, with a precision of about 10 nm.

The first layer of the system (the field emitter array) is advantageously positioned within an ultrahigh vacuum (UHV) chamber to minimize damage to the individual field emitter devices from ion bombardment. However, in the case where the individual field emitter devices are made of DLC, they are robust with regard to ion damage and do not require a UHV environment to function. In general, the rest of the layers of the system do not require a UHV environment to function and the balance of the system can be located within a high vacuum chamber. These two chambers can be separated by a flange that includes a plurality of conductive apertures through which the individual electron beams pass. Thus, there can be differential pumping across this flange. These chambers can be part of a pre-existing lithographic stepper into which the invention is retrofitted.

It should be noted that the structures depicted in FIG. 4 are represented in schematic form for improved clarity. Although the embodiment shown in FIG. 4 includes two magnetic lenses, it is within the level of ordinary skill in the art after having knowledge of the invention disclosed herein to provide the system with any type and/or combination of magnetic and/or electrostatic lenses. Further, it is within the level of ordinary skill in the art after having knowledge of the invention disclosed herein to provide the system with any type and/or combination of electrostatic grids and/or deflectors. Similarly, the system can be provided with an optional mask to filter out wider angles.

Figure 5:
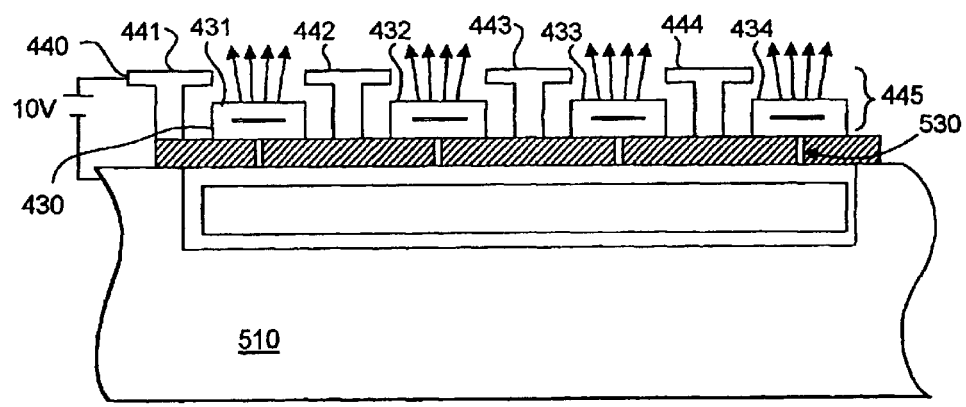
FIG. 5 illustrates a schematic view of a digitally addressable field emitter array, representing an embodiment of the invention.

Referring now to FIG. 5, the FEA 445 which includes the EA 430 and the electrostatic bias grid 440 will be considered in more detail. It will be appreciated that only a portion of the FEA 445 and the EA 430 and grid 440 are shown in FIG. 5. An actual emitter array can contain hundreds, or thousands, or even millions of individual emitters. Similarly, a corresponding bias grid will contain a matched set of openings through which the individual electron beams may pass.

The EA 430 is shown as including a plurality of addressable emitters 431–434 which are capable of emitting electrons from an emitting surface. Of course, the EA 430 can include many, many more emitters than just the four that are depicted in FIG. 5. Together, all the emitters define an emitter array (EA). The electrostatic bias grid 440 is shown as including a plurality of grid elements 441–444 which, when biased, are capable of causing the emitters 431–434 to emit electrons. Of course, the bias grid 440 can include many, many more elements. The bias grid 440 is a final metallic layer on the FEA 445 and should have a relatively small capacitance so that it can be biased a few volts positive or negative within a switching time that is on the order of a microsecond, or less (using a modest power supply), thereby turning the overall writing current of the FEA 445 on and/or off. Together, the EA 430 and the bias grid 440 compose the field emitting array 445 that generates the electron beam matrix 480 which is capable of direct writing a lithographic pattern on a semiconductor wafer coated with a suitable electron resist material.

Control of the electron beam matrix 480 is provided in the following manner. Turn-on, or turn-off, of the entire field emitting array 445 is achieved by switching the bias grid 440 from negative to positive, or from positive to negative, respectively. It must be noted now that an individual bias can be applied to each of the emitters 431–434. More specifically, each of the emitters 431–434 is individually addressable through a connection 530 with regard to the bias of that individual emitter. Thus, the individual beam from each emitter cathode is addressable. When the bias grid 440 is "on" (biased positive), emitters that are biased negative relative to the 440 grid will emit. Therefore, the invention permits patterns to be programmed into the FEA 445 before any such pattern is written onto the target wafer 420.

When the FEA 445 is turned on, as a whole by bias grid 440, the individual bias applied to the individual emitters 431–434 that compose the EA 430 will determine whether that particular emitter is programmed to write or not write. If an individual emitter writes, then it will emit an electron beam that contributes to the overall electron beam matrix that is emitted from the FEA 445. If an individual emitter does not write, that portion of the matrix will be substantially void of electrons. Thus, each individual emitter being in a write-state, or not-write-state, will determine the configuration of the overall electron beam matrix that is generated from the FEA 445.

The bias grid 440 is, in this example, mechanically connected to the EA 430. Each pixel of the FEA 445 includes an emitter tip and an extraction grid portion that together supply the electrical field needed to initiate the emission of electrons. As noted above, in operation, each emitter will be programmed to write or not write. This can be done by grounding the emitter surface to the grid 440 (not-write-state) or applying a relative negative bias to the emitter surface (write-state) that defines an electric field with regard to the bias grid that is at least sufficient to cause emission of electrons from the emitter surface.

The FEA 445 can be microfabricated on a silicon integrated circuit 510 that contains a logic and memory chip 520

(LMC). The LMC 520 is needed to individually control each emitter. Together, the FEA 445, the integrated circuit 510 and the LMC 520 compose an addressable field emitting array (AFEA). Preferably, the addressable field emitting array is a digitally addressable field emitting array so as to permit rapid reprogramming.

It should be noted that the emitters and bias grid are represented in FIG. 5 as simple block-and-T-shaped structures, respectively, for improved clarity. Although the preferred embodiment shown in FIG. 5 includes four block-shaped emitters and four T-shaped grid elements, it is within the level of ordinary skill in the art after having knowledge of the invention disclosed herein to provide an array of any number of emitters, or any suitable configuration. Similarly, it is within the level of ordinary skill in the art after having knowledge of the invention disclosed herein to provide emitters and grid elements of any shape so long as a suitable emitting field is produced.

While not being limited to any particular performance indicator, preferred embodiments of the present invention can be identified one at a time by testing for brightness and low aberration. The test for brightness can be carried out on the field emitting array without undue experimentation by the use of a simple and conventional electron flux detection experiment. The test for low aberration can be carried out on the magnetic lens assembly without undue experimentation by the use of a simple and conventional magnetic field detection experiment.

The invention can write simultaneously with millions of electron beams in an easily programmable field emitter array, potentially writing an entire 1 cm×1 cm chip, with 0.1 micron line widths, in a period of time on the order of 1 second. The invention is also scaleable to line widths up to an order of magnitude smaller (i.e., 10 nm). The invention obviates the need for a physical mask during lithographic processing. In addition to rapidly writing large areas, the invention has the advantage of a digitally programmable virtual mask, which can be reprogrammed for new layers within milliseconds, with no moving parts.

EXAMPLES

Specific embodiments of the invention will now be further described by the following, nonlimiting examples which will serve to illustrate in some detail various features of significance. The examples are intended merely to facilitate an understanding of ways in which the invention may be practiced and to further enable those of skill in the art to practice the invention. Accordingly, the examples should not be construed as limiting the scope of the invention.

A problem with many of the previously reported approaches is that they require a very large, precision, expensive magnetic lens apparatus, and are limited in speed by the current that can pass through the cross-over point of the magnetic lens system. When too much current passes through a small volume, the current experiences a physical phenomenon called "space-charge blow-up." The charge density of the current causes the particles to collide and repel one another and become defocused.

The invention can include an on-chip electrostatic focusing stack. This stack focuses current from each nano-cathode. The focusing stack can be made as part of the process of manufacturing the AFEA chip itself, and thereby be integrated into the chip. The on-chip focusing stack includes a plurality of electrostatic elements, one for each nano-cathode. The on-chip electrostatic focusing stack can focus the current from the nano-cathode at a distance of from approximately 20 to approximately 100 microns from the AFEA (the exact distance involves the choice of the e-beam spot-size at the focus).

In this way, there is no cross-over point where all the nano-cathode currents are super-imposed, and since the current from each nano-cathode is below the threshold for space-charge blowup over the focusing distance, there is no space-charge blowup, and no limit to the current that can be achieved by adding additional chips or more nanocathodes per chip. The cost of a massively parallel EBDW (e-beam direct write) lithography system is substantially decreased and the speed increased with the electrostatically focused version of the AFEA chips. Additionally, the current regulation circuit insures uniform lithographic exposure of the wafer, so that a well-controlled lithographic process can be developed.

This allows elimination of large expensive magnetic lens systems, and potentially allows an entire 300 mm semiconductor wafer to be lithographically exposed by an array of AFEA chips with electrostatic focusing. The array of chips would be assembled as a backplane and the wafer would pass underneath the array on a precision linear translation stage (e.g. within a lithographic stepper). By appropriately programming the current to each nano-cathode, and arranging the chips so that each column of pixels to be exposed on the wafer passes beneath approximately 10 or 12 cathodes as it is traversed under the AFEA array, an entire 300-mm wafer could be lithographically exposed by the electron beams from the AFEA cathodes in a period of approximately 30 seconds. Of course, other configurations are possible.

The invention can include a current copier or memory circuit as part of the logic, memory, and control circuits integrated on the addressable field emission array chips (AFEA's). There is one current-copier circuit for each nano-cathode. The current copier circuit causes each of the nano-cathodes on an AFEA chip to emit substantially the same current. This current-copier circuit can be fabricated directly on the chip, along with the logic, memory, and control circuits for each nano-cathode. Thus, all of the circuits can be integrated into the chip design and produced lithographically on the chip itself with the nanocathodes.

The invention can include, for substantially perfect reliability or for massively parallel scanning electron microscopy, replacement of the space used by some (e.g., approximately half) of the emitters with detectors. Preferably, these detectors are electron detectors and/or photodetectors (photodetectors would require a luminescent photoresist or layer on the substrate). In the case of electron detectors, such a system could also be used as a massively parallel SEM (scanning electron microscope). The electron detectors or photodetectors would measure the number of electrons back-reflected or striking the surface of the target below, and thereby allow a picture of the surface geometry to be built up, as in standard SEM practice, but in a massively parallel fashion.

Such a system could be used to rapidly scan an entire wafer for defects, for example, in a matter of approximately 60 seconds, or less. The exact time required to scan would be governed by the number of chips used, the clock rate for the system, and the actual size of the wafer being scanned.

It can be appreciated that the replacement of half the AFEA emitters with an electron detector or photodetector allows substantially absolute verification that every pixel on a semiconductor wafer is exposed. As noted above, if the detector is an electron detector, then the same system can be used as a super-fast massively parallel low-voltage SEM (scanning electron microscope) to inspect semiconductor wafers for defects. There is presently, according to the Semiconductor Industry Association 1997 version of the "National Technology Roadmap for Semiconductors" no known solution for high speed inspection of patterned semiconductor wafers (10,000 cm$^2$/hour) for feature sizes of 130 nm and smaller. This invention provides a solution to that problem, since it would potentially allow wafer inspection at rates of up to approximately 85,000 cm$^2$/hour.

The invention also includes a system design for massively parallel e-beam direct write (EBDW) semiconductor lithography. Each cathode can be digitally addressed with a bucket-brigade logic scheme similar to that used by charge-coupled device, CCD, cameras (passing 0's and 1's however, rather than charge). Some embodiments of the invention can have more than $10^6$ individually addressable field-emission cathodes on a single 1-cm integrated circuit. Optional extensions to the AFEA lithography design include individual current-source to drive each emitter for tightly controlled charge delivery, and the addition of on-chip electrostatic focusing for each emitter (as opposed to magnetic lens focusing). With on-chip electrostatic focusing, an array of 300 of these chips (30 across by an average of 10 deep) suspended on a back-plane 20 to 100 microns above a semiconductor wafer could lithographically expose a whole 300 mm wafer, with 40-nm pixels, in 30 seconds. The on-chip electrostatic focusing can include additional grids produced lithographically above the emitters and first control grid, separated by dielectric (nominally low-temperature SiO$_2$) layers.

As an example of the lithography system, the separation distances and voltages between the electrostatic stack grids can be designed to focus each of a plurality of 200-nm cathodes to a corresponding 20-nm spot size at a distance of about 30-microns from the chip. Alternatively the grids can be designed to focus to a 40-nm spot size with about a 60-micron working distance between the AFEA chip array and wafer to be exposed.

Figure 6:
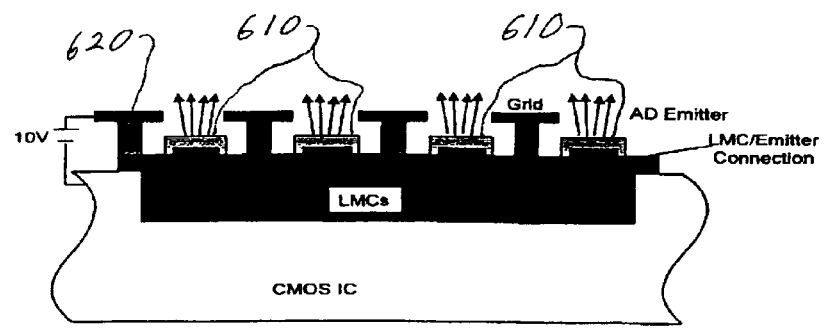
FIG. 6 illustrates a schematic view of an AFEA chip where the logic, memory, and control circuits (LMC's) include the current-source circuitry, representing an embodiment of the invention.

Referring to FIG. 6, a schematic of an example of an AFEA chip is shown. The solid state emitter cathodes 610 are about 200 nm in diameter and are arranged on an approximate 4-micron pitch. Most of the area between cathodes is used for the logic, memory, and control circuits (LMC's) which control whether an individual pixel is on or off, and also regulate the current for emitters/pixels that are turned on. The entire array is turned on or off by regulating the first grid 620 voltage above the cathodes (e.g. 10V in FIG. 6), so that a chip can not only be turned on or off as a whole with the first grid 620, but each individual emitter can be programmed on or off individually with the LMC'S. This allows every pixel on a wafer to be individually written as the wafer passes under the AFEA array.

If the density of emitters is high in the AFEA's with regard to the design rules of the work pieces, the chips can be angled slightly to the wafer (an angle of 20 nm in 4 microns with respect to the linear translation stage of the wafer for a 20 nm focused spot size, 40 nm in 4 microns for a 40 nm focused spot). With this arrangement multiple emitters on the AFEA array can individually address every 40-nm pixel on a 300-mm wafer. This allows for redundancy of emitters addressing any pixel on the wafer, in case of failure of a particular emitter, and also opens up the possibility of gray-scale illumination of the photo-resist. Gray-scale illumination can also be achieved by modulating the on time of the entire AFEA chip. Pixels to receive a particular illumination are programmed on for the gray-scale illumination, as required.

Figure 7:
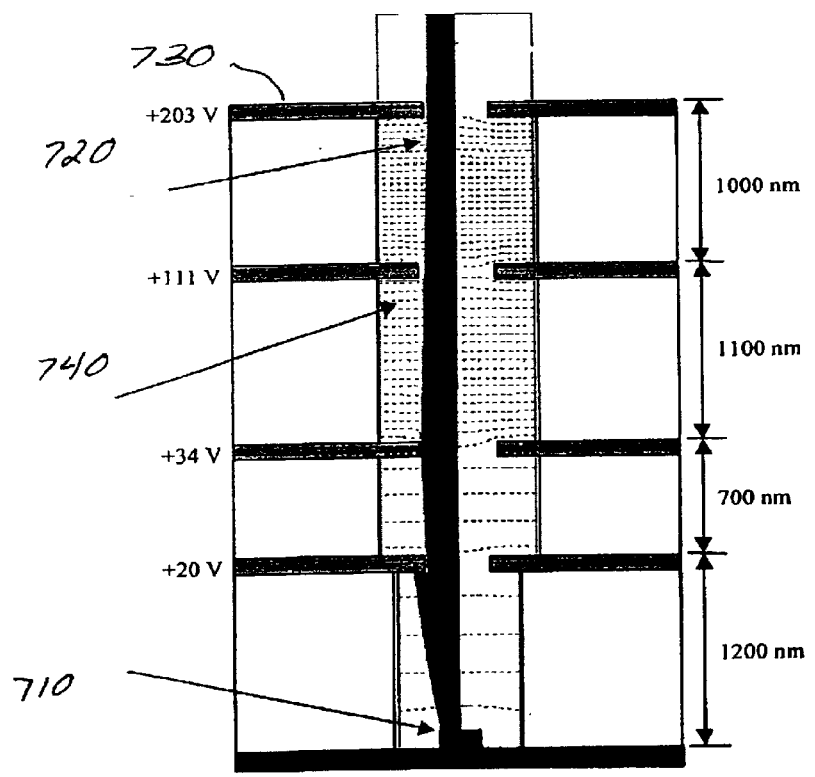
FIG. 7 illustrates a schematic view of an electrostatic focusing stack design for a flat AFEA emitter where the focus is at 30 microns from the last grid, representing an embodiment of the invention.

Referring to FIG. 7 an exemplary layout for the stack of electrostatic focusing grids is shown. In this particular example, the grid stack is about 4 microns deep with a 200-nm diameter emitter 710. The emitter 710 can be a flat uniformly emitting cathode. This stack could be produced by conventional lithographic methods with the emitter laid down on a pad that is located on top of the LMC's shown in FIG. 5.

Referring again to FIG. 7, in this particular example, the emitted beam 720 is focused to a spot less than 20-nm in diameter FWHM (full-width at half maximum) at a working distance of 30-microns from the AFEA final grid 730. There can be potential surfaces 740 between the grids.

If 100% reliability is desired, every other emitter/cathode can be replaced by an electron detector or photodetector to verify operation of every emitter on every pulse. In the case of photodetectors, preferred embodiments of the invention utilize a luminescent layer on the resist or target. If an electron detector is used, this would allow the system to also operate as a massively parallel Scanning Electron Microscope (SEM). By clocking out to a computer the charge received by each detector each time the array is fired, an image of the substrate underneath the array could be built up. This is massively parallel, and the wafer is scanned linearly by a stage, rather than electronically scanning the electron beam.

The invention can avoid space charge limitation. Because the current is so small, the 100 pA emitter beams do not blow up over a 100-micron length. Each chip will produce a time-average current of 1 micro-amp, from more than $10^6$ cathodes (~100 pA from each nanocathode for 1 microsecond, time averaged over a frequency of 1 to 2 kHz). Every chip added to the system adds another micro-amp of average current, up to the point where the wafer is fully over-laid with chips. This means that the maximum possible time-average current is around 700 micro-amps for the implementation discussed here on a single 300 mm diameter wafer. However, this increases as the density of cathodes is increased for new generations of the AFEA chip with smaller feature sizes, and more than one wafer may be passing under the array at any one time. Wafer writing speed will be limited by stage speed and the number of AFEA chip modules installed, not by available current as in conventional magnetically focused e-beam lithography.

The invention can posses modularity. For instance, systems can be designed in increments of 1-cm chips. Speed and cost can be traded off to optimize system design. More chips leads to a faster system, fewer chips leads to a less expensive system. The data processing can also be modularized. One optical fiber at a Gigabyte/second would provide adequate data for one chip. Each chip could be driven by its own CPU(s) and RAID disk array for data.

The invention has the possibility of extremely high throughput. For chips with emitters on a 4 micron pitch, focused to a 40 nm pixel on the wafer, clocked at 1000 electron pulses per second per emitter, an array of 30 chips wide by 10 chips deep (average), this embodiment could write an entire 300-mm wafer in 30 seconds, by dragging the wafer linearly at 1 cm/sec beneath the array.

The invention can have great depth of focus: For the example shown in FIG. 7, the depth of focus is excellent. Specifically, the depth of focus can be on the order of 4 microns (~2 microns on each side of the actual focus). Transverse (thermal) electron velocity and spherical aberration limit the actual focal spot size in this example.

Figure 8:
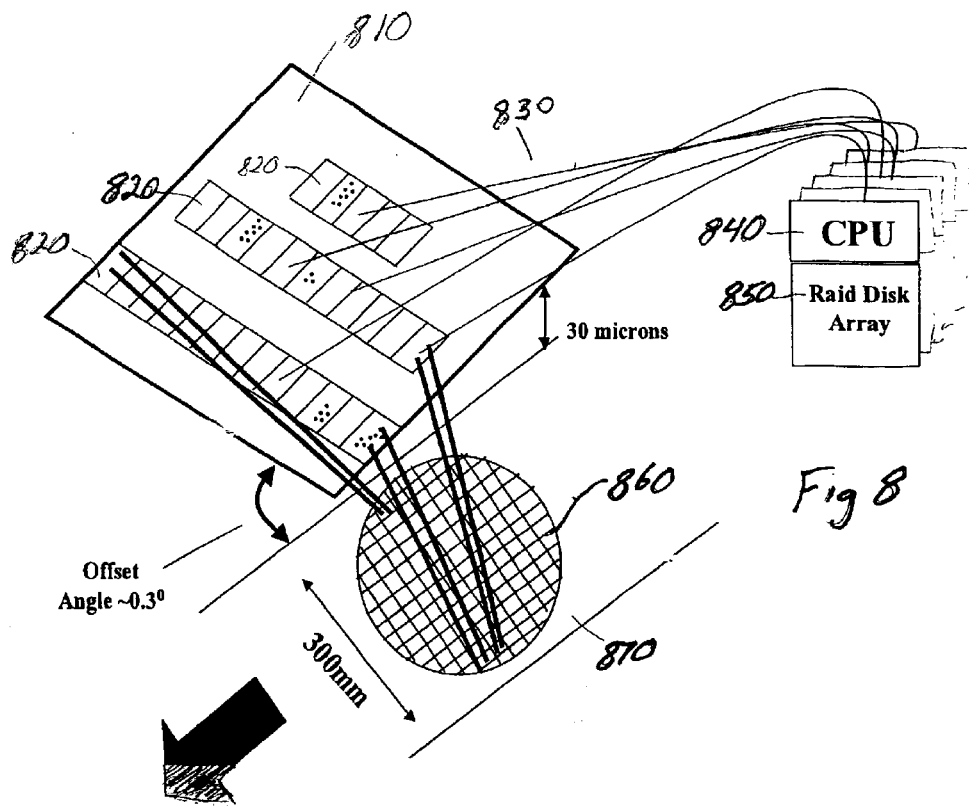
FIG. 8 illustrates a schematic perspective view of a massively parallel electrostatically focused EBDW system schematic, representing an embodiment of the invention.

FIG. 8 shows a perspective view of what a lithographic system incorporating an array 810 of electrostatically focused AFEA chip sources 820 could look like. Each of the chip sources 820 is coupled to an optical fiber 830. The data transmission rate provided by these fibers can be approximately 1 Gigabyte per fiber. Each optical fiber 830 coupled in-turn to a CPU 840 and a corresponding Raid disk array 850. The AFEA chip array at its widest point could be 30 chips across (for a 300 mm wafer, 30 chips at 1-cm each would just cover it), and on average would be 10 chips deep. FIG. 8 shows 3 rows that are 13, 11 and 5 chips across, respectively. At the edge of the wafer, 10 chips might be too deep (just a few chips would be adequate to expose the outermost row of the wafer), so the exact number of chips in each column would be calculated for a particular system or wafer size. In this particular example, each of the chips is capable of emitting $10^6$ beamlets. Only beamlets from three of the chips are shown in FIG. 8. Because of the very high density and redundancy of emitters only a linear translation stage (x-translation stage movement shown with a single headed arrow) would be required. No translation in the y-direction would be necessary. If fewer AFEA modules were desirable (e.g., for a lower cost, lower throughput system) then an x-y stepper/translation stage could be used.

In the particular example depicted in FIG. 8, a wafer 860 positioned on a wafer stage 870 is approximately 30 microns from the array 810. In this particular example, there is an offset angle of approximately 0.3 degrees between the wafer stage 870 and the array 810. Because of the slight offset, beamlets from serially adjacent chips can redundantly light (strike) the die (work piece) immediately upstream as the wafer 860 is translated by the stage 870.

Logic, Memory, and Control Circuits

Figure 9:
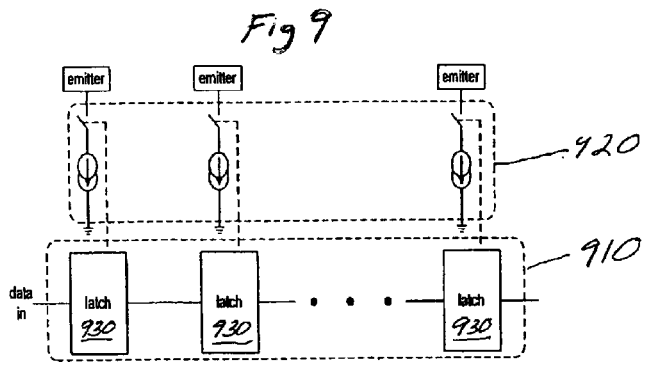
FIG. 9 illustrates an AFEA control electronics block diagram, representing an embodiment of the invention.

The AFEA can be controlled using a logical shift register 910 and current regulator circuit 920 realized in a small geometry CMOS IC process as illustrated in FIG. 9. The shift register 910 allows a pattern of "on" and "off" pixels to be stored on the AFEA chip, while the current regulator circuit 920 compensates for pixel-to-pixel variations in turn-on voltage and maintains good matching of pixel currents.

It is desirable to minimize the area (real estate) required to implement the circuitry. To minimize the area required to realize the circuitry, the latches 930 that compose shift register 910 could be realized as cascaded dynamic memory cells.

Figure 10:
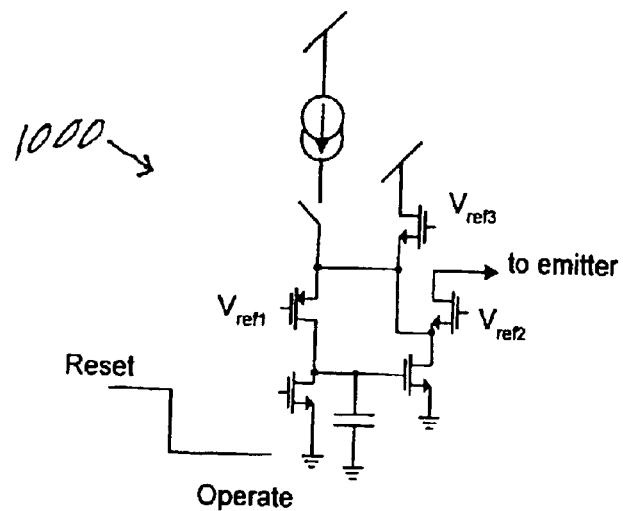
FIG. 10 illustrates a circuit schematic of a current memory cell, representing an embodiment of the invention.

Referring to FIG. 10, a current memory cell 1000 can be used for the current regulation circuit. This circuit 1000 is fundamentally a dynamic memory whose output current is set by a reference current. If the same reference current is used for all memories in the AFEA and the effects of charge injection and output impedance are minimized by design, adequate matching between pixels is assured.

Figure 11:
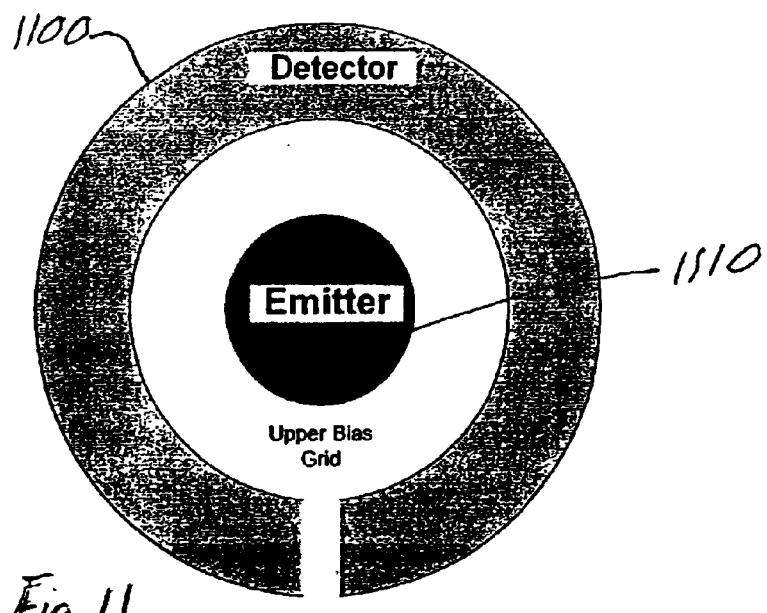
FIG. 11 illustrates a schematic view of an emitter/detector configuration for monitoring pixel operation, representing an embodiment of the invention.

Referring to FIG. 11, real time detection of emitter operation may be obtained by monitoring the back-reflection or secondary emission of electrons or fluorescence from the photoresist on the semiconductor wafer pixels being exposed. A detector 1100 can be arranged as a split-ring surrounding an emitter 1110 as shown in FIG. 11. If instead of an electron detector, a photodetector were used, the detector could be a shallow n- or p-diffusion area in the control circuitry substrate and an optically clear split-ring opening in the focusing stack could be required. Alternatively, a biased metal split-ring at the top level of the focusing stack could be used to detect secondary electrons. The detector circuitry could replace approximately half of the LMC circuits, and could be integrated into the chip. A signal could be passed out in bucket-brigade fashion, similar to the manner that CCD's are read out, preserving the charge received by the detector 1100 during exposure of the substrate.

Many of the features of the invention have alternative versions. There are numerous alternative versions, differing in voltage, grid opening size, and grid separation, of the lithographically integrated electrostatic focusing optics. There are many variations of the current copier circuits. The architecture for mounting the AFEA chips on a backplane to run a substrate under either for lithography or scanning electron microscopy has innumerable variations for number of chips, placement of the chips, etc. The integrated digitally addressable nano-cathodes themselves are subject to innumerable possible variations of geometry or emitter material. There are also versions of the electrostatic focusing stack design which have a negative potential on the center electrode. This could potentially be of benefit in preventing positive ions from entering the stack and impacting the cathode. Many alternative versions of the detector geometry for the case of a massively parallel SEM are possible.

An advantage of the invention includes an electrostatic focusing stack integrated onto the chip, produced lithographically, one focusing stack for every one of the integrated cathodes on the chip. Previously reported approaches involving electrons or ions have discrete focusing methods. None of the previously reported approaches are integrated on to the chip, and none of them have individually digitally addressable nano-cathodes integrated on to the chip.

An advantage of the invention is that space-charge blow up can be avoided. The SCALPEL[5], micro-columns[4], and ion beam[7] lithographic techniques are all limited in current by space-charge. The massively parallel AFEA's with electrostatic focusing may be limited by stage velocities, but not by available current.

An advantage of the invention is the ability to perform extremely high speed lithography with very small feature sizes. None of the previously reported approaches[4-10] are capable of high-speed (greater than one 300 mm wafer per minute) with small feature sizes (100 nm or smaller). None of the previously reported approaches are capable of printing feature sizes at 50 nm and smaller with any reasonable throughput. The previously reported approaches are limited either by charged particle optics (Scalpel, micro-column, ion-projection) or photon optics (for EUV and X-ray).

An advantage of the invention is the capability to act as a massively parallel SEM system for semiconductor wafer inspection. Replacing every other cathode and its LMC circuits with a detector and detector circuitry allows the system to inspect wafers at a rate several orders of magnitude faster than can be achieved by either micro-columns or standard SEM technology. There is nothing else presently known that could achieve this rate of wafer inspection (up to 85,000 $cm^2$ per hour, or faster, for a single massively parallel AFEA SEM system).

An advantage of the invention is the capability to provide current copier circuits for current equalization between pixels. The current copier circuits for current equalization between pixels are not available on any other lithographic system.

An advantage of the invention is that only a single scanning stage (one direction) is required. All of the previously reported approaches require at least two-dimensional scanning and control. The previously reported scanning stages must be interfermoetrically driven with a precision on the order of nanometers, and are extremely expensive. Elimination of one of these stages greatly reduces the cost of the system.

An advantage of the invention is that large (expensive) focusing optics can be avoided. All of the previously reported approaches require very large, precision, focusing optics. The optics for the AFEA's are lithographically and inexpensively integrated right on to the chip. Thus, the system cost is greatly reduced.

An advantage of the invention is that embodiments are easily upgradeable to the next generation. Replacing the chips on a system and upgrading the software will be all that is necessary to upgrade a system to the next generation of lithography. The computer control system, etc. can be retained. It may however, be necessary to upgrade hardware to achieve the full speed possibilities of a particular next-generation AFEA chip (i.e., rate of data clocking, etc.). Nevertheless, it will be entirely feasible to upgrade a system to a new (smaller) feature size by just replacing the AFEA chips and upgrading the software. All the rest of the hardware will be re-usable.

An advantage of the invention is that the technology can be maskless. The EUV[8], XRPL[6], IPL[7], and SCALPEL[5] technologies all require a mask. It is projected that masks will soon be more expensive than all of the capital equipment cost for semiconductor lithography, regardless of technology. A digitally programmable maskless technology has a tremendous cost advantage in this environment.

Practical Applications of the Invention

A practical application of the invention that has value within the technological arts is writing patterns on electron resists. Further, the invention is useful in conjunction with lithographic stepper (such as are used for the purpose of semiconductor lithography), or in conjunction with massively parallel scanning electron microscopes (such as are used for the purpose of inspection), or the like. There are virtually innumerable uses for the invention, all of which need not be detailed here.

All the disclosed embodiments of the invention described herein can be realized and practiced using conventional materials, subcomponents and subcombinatorial procedures without undue experimentation. Although the best mode contemplated by the inventors of carrying out the present invention is disclosed above, practice of the present invention is not limited thereto. It will be manifest that various additions, modifications and rearrangements of the features of the present invention may be made without deviating from the spirit and scope of the underlying inventive concept. Accordingly, it will be appreciated by those skilled in the art that, within the scope of the appended claims, the invention may be practiced otherwise than as specifically described herein.

For example, the electron beam matrix source could be enhanced by providing additional electrostatic grids and/or magnetic lenses and/or deflection plates. Similarly, although diamond-like carbon (DLC) is preferred for the emitting surface, any field emitting material could be used in its place. In addition, the individual components need not be fabricated from the disclosed materials, but could be fabricated from virtually any suitable materials.

Moreover, the individual components need not be formed in the disclosed shapes, or assembled in the disclosed configuration, but could be provided in virtually any shape, and assembled in virtually any configuration, which affects electrons so as to provide an addressable field emitter array.

Further, although the addressable field emitter array described herein is a physically separate module, it will be manifest that the array may be integrated into the apparatus with which it is associated. Furthermore, all the disclosed features of each disclosed embodiment can be combined with, or substituted for, the disclosed features of every other disclosed embodiment except where such features are mutually exclusive.

It is intended that the appended claims cover all such additions, modifications and rearrangements. Expedient embodiments of the present invention are differentiated by the appended subclaim.

REFERENCES

1. The Electrical Engineering Handbook, CRC Press, (Richard C. Dorf et al. eds., 1993).
2. Thin Film Processes, Academic Press, Inc., (John L. Vossen et al. eds., 1978).
3. Van Nostrand's Scientific Encyclopedia, 8th ed., Van Nostrand Reinhold, (Douglas M. Considine et al. eds., 1995).
4. T. H. P. Chang, et al., "Electron-Beam Microcolumns for Lithography and Related Applications," J. Vac. Sci. Technol. B, v. 14, no. 6, 1996, pp. 3774–3781.
5. Lloyd R. Harriott, "Scattering With Angular Limitation Projection Electron Beam Lithography," J. Vac. Sci. Technol. B, v. 15, no. 6, 1997, pp. 2130–2135.
6. Scott Hector, et al., "X-ray Lithography for <=100 nm Ground Rules in Complex Patterns", J. Vac. Sci. Tech. B, V. 15, no. 6, 1997, pp. 2517–2521.
7. J. Melngailis, "A Review of Ion Projection Lithography," J. Vac. Sci. Technol. B, v. 16, no. 3, 1998, pp. 927–957.
8. C. W. Gwyn, et al., "Extreme Ultraviolet Lithography," J. Vac. Sci. Technol. B, v. 16, 1998, pp. 3142–3149.
9. Standard SEM, e.g., "Scanning Electron Microscopy", by P. R. Thornton, 1968, Chapman and Hall, London.
10. M. A. Sturans, et al., "EL5: One Tool for Advanced X-ray and Chrome on Glass Mask Making," J. Vac. Sci. Technol. B, v. 16, no. 6, pp. 3164–3167.

What is claimed is:

1. An addressable field-emission array, comprising:
   a plurality of individually bias addressable cathodes, each of the plurality of individually bias addressable cathodes including an electron beam current control circuit including a current copier circuit that causes each of the plurality of individually bias addressable cathodes to emit substantially the same current, the current copier circuit including a current regulator circuit that compensates for pixel-to-pixel variations in turn-on voltage and maintains matching of pixel currents, the current regulator circuit including a current memory cell whose output current is set by a reference current; and
   an electrostatic focusing stack coupled to said plurality of individually bias addressable cathodes,
   wherein the plurality of individually bias addressable cathodes and the electrostatic focusing stack are integrated on the addressable field-emission array.

2. The addressable field-emission array of claim 1, further comprising: a plurality of detectors coupled to said plurality of individually bias addressable cathodes.

3. A maskless digital e-beam direct write lithography system, comprising an addressable field-emission array, including:
   a plurality of individually bias addressable cathodes, each of the plurality of individually bias addressable cathodes including an electron beam current control circuit including a current copier circuit that causes each of the plurality of individually bias addressable cathodes to emit substantially the same current, the current copier circuit including a current regulator circuit that compensates for pixel-to-pixel variations in turn-on voltage and maintains matching of pixel currents, the current regulator circuit including a current memory cell whose output current is set by a reference current; and an electrostatic focusing stack coupled to said plurality of individually bias addressable cathodes, wherein the plurality of individually bias addressable cathodes and the electrostatic focusing stack are integrated on the addressable field-emission array.

4. The maskless digital e-beam direct write lithography system of claim 3, further comprising: a plurality of detectors coupled to said plurality of individually bias addressable cathodes, wherein the plurality of individually bias addressable cathodes, the plurality of detectors and the electrostatic focusing stack are integrated on the addressable field-emission array.

5. A scanning electron microscope, comprising an addressable field-emission array, including:

a plurality of individually bias addressable cathodes, each of the plurality of individually bias addressable cathodes including an electron beam current control circuit including a current copier circuit that causes each of the plurality of individually bias addressable cathodes to emit substantially the same current, the current copier circuit including a current regulator circuit that compensates for pixel-to-pixel variations in turn-on voltage and maintains matching of pixel currents, the current regulator circuit including a current memory cell whose output current is set by a reference current; and and a plurality of detectors coupled to said plurality of individually bias addressable cathodes, wherein the plurality of individually bias addressable cathodes and the plurality of detectors are integrated on the addressable field-emission array.

6. The scanning electron microscope of claim 5, further comprising: an electrostatic focusing stack coupled to said plurality of individually bias addressable cathodes, wherein the plurality of individually addressable cathodes, the plurality of detectors and the electrostatic focusing stack are integrated on the addressable field-emission array.

7. A method of operating an addressable field-emission array, comprising:

generating a plurality of electron beams from a plurality of individually bias addressable cathodes that define said addressable field-emission array, each of the plurality of individually bias addressable cathodes including an electron beam current control circuit including a current copier circuit that causes each of the plurality of individually bias addressable cathodes to emit substantially the same current, the current copier circuit including a current regulator circuit that compensates for pixel-to-pixel variations in turn-on voltage and maintains matching of pixel currents, the current regulator circuit including a current memory cell whose output current is set by a reference current; and focusing at least one of said plurality of electron beams with an electrostatic focusing stack, wherein the plurality of individually bias addressable cathodes and the electrostatic focusing stack are integrated on the addressable field-emission array.

8. The method of claim 7, further comprising receiving a signal that is elicited by said plurality of electron beams with a plurality of detectors that are coupled to said plurality of individually bias addressable cathodes.

9. A method of scanning electron microscopy, comprising:

generating a plurality of electron beams from a plurality of individually bias addressable cathodes that define an addressable field-emission array, each of the plurality at individually bias addressable cathodes including an electron beam current control circuit including a current copier circuit that causes each of the plurality of individually bias addressable cathodes to emit substantially the same current, the current copier circuit including a current regulator circuit that compensates for pixel-to-pixel variations in turn-on voltage and maintains matching of pixel currents, the current regulator circuit including a current memory cell whose output current is set by a reference current;

focusing at least one of said plurality of electron beams with an electrostatic focusing stack; and acquiring an image with a plurality of electron detectors coupled to said plurality of individually bias addressable cathodes, wherein the plurality of individually bias addressable cathodes, the electrostatic focusing stack and the plurality of electron detectors are integrated on the addressable field-emission array.

10. The method of claim 9, further comprising traversing a target located on a stage that is coupled to said addressable field-emission array to scan said at least one of said plurality of electron beams across a surface of said target.

11. A method of e-beam lithography, comprising:

generating a plurality of electron beams from a plurality of individually bias addressable cathodes that define an addressable field-emission array, each of the plurality of individually bias addressable cathodes including an electron beam current control circuit including a current copier circuit that causes each of the plurality of individually bias addressable cathodes to emit substantially the same current the current copier circuit including a current regulator circuit that compensates for pixel-to-pixel variations in turn-on voltage and maintains matching of pixel currents, the current regulator circuit including a current memory cell whose output current is set by a reference current;

focusing at least one of said plurality of electron beams with an electrostatic focusing stack; and exposing an e-beam resist with said plurality of electron beams, wherein the plurality of individually bias addressable cathodes and the electrostatic focusing stack are integrated on the addressable field-emission array.

12. The method of claim 11, wherein exposing said e-beam resist includes generating a gray-scale pattern in said e-beam resist.

13. The method of claim 11, further comprising characterizing the exposure of the e-beam resist with a plurality of detectors that are integrated on the addressable field-emission array.

* * * * *